(12) United States Patent
Keeton et al.

(10) Patent No.: US 7,033,445 B2
(45) Date of Patent: Apr. 25, 2006

(54) GRIDDED SUSCEPTOR

(75) Inventors: Tony J. Keeton, Mesa, AZ (US); Zachary L. Lutz, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 289 days.

(21) Appl. No.: 10/327,296

(22) Filed: Dec. 20, 2002

(65) Prior Publication Data
US 2003/0140850 A1    Jul. 31, 2003

Related U.S. Application Data

(60) Provisional application No. 60/343,979, filed on Dec. 27, 2001.

(51) Int. Cl.
*H01L 21/00* (2006.01)
*C23C 16/00* (2006.01)

(52) U.S. Cl. .................. 118/725; 118/724; 118/728; 118/500; 118/715; 156/345.51; 156/345.52; 156/345.53; 219/444.1; 219/544; 392/416; 392/418; 204/192.1; 204/298.01; 279/128; 279/3; 361/234

(58) Field of Classification Search ............. 118/725, 118/728, 715, 724, 500; 156/345.51, 345.52, 156/345.53; 219/444.1, 544; 392/416, 418; 204/298.01, 192.1; 279/128, 3
See application file for complete search history.

(56) References Cited

U.S. PATENT DOCUMENTS

| 4,560,420 A | 12/1985 | Lord |
| 4,978,567 A | 12/1990 | Miller |
| 4,986,215 A | 1/1991 | Yamada et al. |
| 5,188,501 A | 2/1993 | Tomita et al. |
| 5,198,034 A | 3/1993 | deBoer et al. |
| 5,242,501 A | 9/1993 | McDiarmid |
| 5,403,401 A | 4/1995 | Haafkens et al. |
| 5,427,620 A | 6/1995 | De Boer et al. |
| 5,514,439 A | 5/1996 | Sibley |
| 5,588,827 A | 12/1996 | Muka |
| 5,690,742 A | 11/1997 | Ogata et al. |
| 5,761,023 A | 6/1998 | Lue et al. |
| 5,800,622 A | 9/1998 | Takemi et al. |
| 5,803,977 A | 9/1998 | Tepman et al. |
| 6,001,183 A | 12/1999 | Gurary et al. |
| 6,113,702 A | 9/2000 | Halpin et al. |
| 6,203,622 B1 | 3/2001 | Halpin et al. |
| 6,245,152 B1 | 6/2001 | Imai et al. |
| 6,394,797 B1 | 5/2002 | Sugaya et al. |
| 6,506,257 B1 * | 1/2003 | Horiguchi et al. ......... 118/725 |

FOREIGN PATENT DOCUMENTS

| JP | 7-07018438 | 1/1995 |
| JP | 8-08148541 | 6/1996 |
| JP | 2000.315720 | 11/2000 |

* cited by examiner

*Primary Examiner*—Ram N Kackar
(74) *Attorney, Agent, or Firm*—Knobbe Martens Olson & Bear (57) ABSTRACT

Susceptor designs are provided for controlling damage to wafers, particularly during cold wafer drops-off on a hot susceptor. The designs include axisymmetric grid designs, such that thermal gradients are symmetrical in the circumferential (θ) direction and the same traversing any particular radial line. The grids are preferably arcuate and each have the same surface area. In one embodiment an outer zone is asymmetrically designed to induce predictable wafer curling in a saddle shape.

10 Claims, 7 Drawing Sheets

*FIG. 8*

GRIDDED SUSCEPTOR

REFERENCE TO RELATED APPLICATION

This application claims the priority benefit under 35 U.S.C. §119(e) of provisional application No. 60/343,979, filed Dec. 27, 2001.

FIELD OF THE INVENTION

The invention relates generally to susceptors for supporting semiconductor substrates in process chambers, and more particularly, to susceptor configurations for tailored thermal effects.

BACKGROUND OF THE INVENTION

Semiconductor fabrication processes are typically conducted with the substrates supported within a chamber under controlled conditions. For many processes, semiconductor substrates (e.g., silicon wafers) are heated inside the process chamber. For example, substrates can be heated by direct physical contact with an internally heated wafer holder or "chuck." "Susceptors" are wafer supports used in radiantly heated system where the wafer and susceptor absorb radiant heat.

Susceptors are commonly formed by machining graphite into a desired shape and applying silicon carbide (SiC) coatings. Susceptors can be formed in different shapes, but many are circular. Susceptors are often formed with grid patterns on the front face, the surface which faces the wafer. These patterns are normally configured to provide a volume underneath the wafer to allow gas to compress and escape, to minimize wafer sliding when a wafer is placed on a susceptor, and for gas to expand and flow in under the wafer, to minimize wafer sticking when the wafer is lifted from the susceptor. See U.S. Pat. No. 5,403,401.

Current susceptor designs, particularly those designed to accommodate 200 mm, 300 mm or larger wafers, generate large temperature gradients when a cold wafer is loaded onto a hot susceptor. These temperature gradients in the wafer cause the wafer to curl. During this curl, damage to the backside of the wafer can occur through contact with the susceptor. Therefore, minimizing backside damage is highly desirable in the field of wafer processing.

It has been found that the asymmetrically high surface area on the susceptor front side as compared to the flat backside, in combination with the differential coefficient of thermal expansion (CTE) of the graphite core and SiC coating, results in the susceptor bowing or "dishing" into a bowl shape during high temperature susceptor fabrication processes. U.S. Pat. No. 5,403,401 provides the same grid pattern on the susceptor backside, avoiding the front and backside differential and thereby avoiding the dishing phenomenon. However, the concave dish shape has been found advantageous in minimizing wafer curl upon cold wafer drop-off. On the other hand, conventional gridded susceptors, with grids arranged in an X-Y checkered configuration, have been found to cause uneven dishing, which can result in an asymmetric "saddle" shaped susceptor, rather than a "dish" shape. A saddle shaped susceptor causes damage to the backside of a wafer, leaving the wafer with defective sections. Susceptor warping is especially damaging when processing large wafers.

Accordingly, a need exists for better control over susceptor shape, and for reducing backside damage to wafers form wafer curl.

SUMMARY OF THE INVENTION

In accordance with one aspect of the present invention, there is provided a grid patterned susceptor, comprising a circular susceptor face and a grid pattern on the face of the susceptor. The grid pattern is configured with a plurality of arcuate grids each having substantially the same surface area.

In accordance with another aspect of the present invention, a grid patterned susceptor is provided comprising a susceptor front face having at least two low thermal conductance areas on the susceptor face and two high conductance areas. Each high conductance area is located between two low conductance areas. In addition, the high conductance areas are configured to have higher conductive heat flux paths relative to the low conductance areas.

In accordance with yet another aspect of the present invention, a method of controlling damaging effects of wafer warping during fabrication is provided. The method comprises intentionally warping a wafer during wafer drop-off onto a wafer holder, which is hotter than the wafer upon drop-off in order to direct the warping of the wafer to a predicted, In accordance with a further aspect of the present invention, a method of fabricating wafers is provided. The method comprises consistently warping each wafer in a substantially uniform wafer batch, so that, during drop-off onto a wafer holder which is hotter than the wafer, each wafer warps into substantially the same shape relative to other wafers in the batch.

In accordance with an additional aspect of the present invention, a method of fabricating a circular susceptor is provided. The method comprises building a gridded susceptor comprising a first material coated by a second material and forming arcuate grids having substantially equal surface areas on the front face of the susceptor.

In one embodiment, grids of constant surface areas are formed with reducing radical length at greater distances from the susceptor center, compensating for increasing circumferential length. Advantageously, this design tends to control and reduce the degree of wafer warping.

In another embodiment, circumferential asymmetry is provided to the grid surface areas. Accordingly, gradients are intentionally introduced upon loading a cold wafer on the hot susceptor. Advantageously, the wafer curls in a predictable fashion, reducing the randomness of the direction in which the wafer warps during processing.

DETAILED DESCRIPTION OF THE PREFERRED EMBODIMENT

The susceptors described herein are preferably implemented in machined graphite coated with ceramic, more preferably coated with silicon carbide (SiC). The bottom or backside has a substantially reduced surface area, compared to the frontside, such that dishing can be induced by thermal processing. Preferably, the susceptors are employed in cold wall, radiantly heated semiconductor processing chambers. During processing, a wafer is placed with its backside face parallel to the top face of the susceptor.

Figure 1:
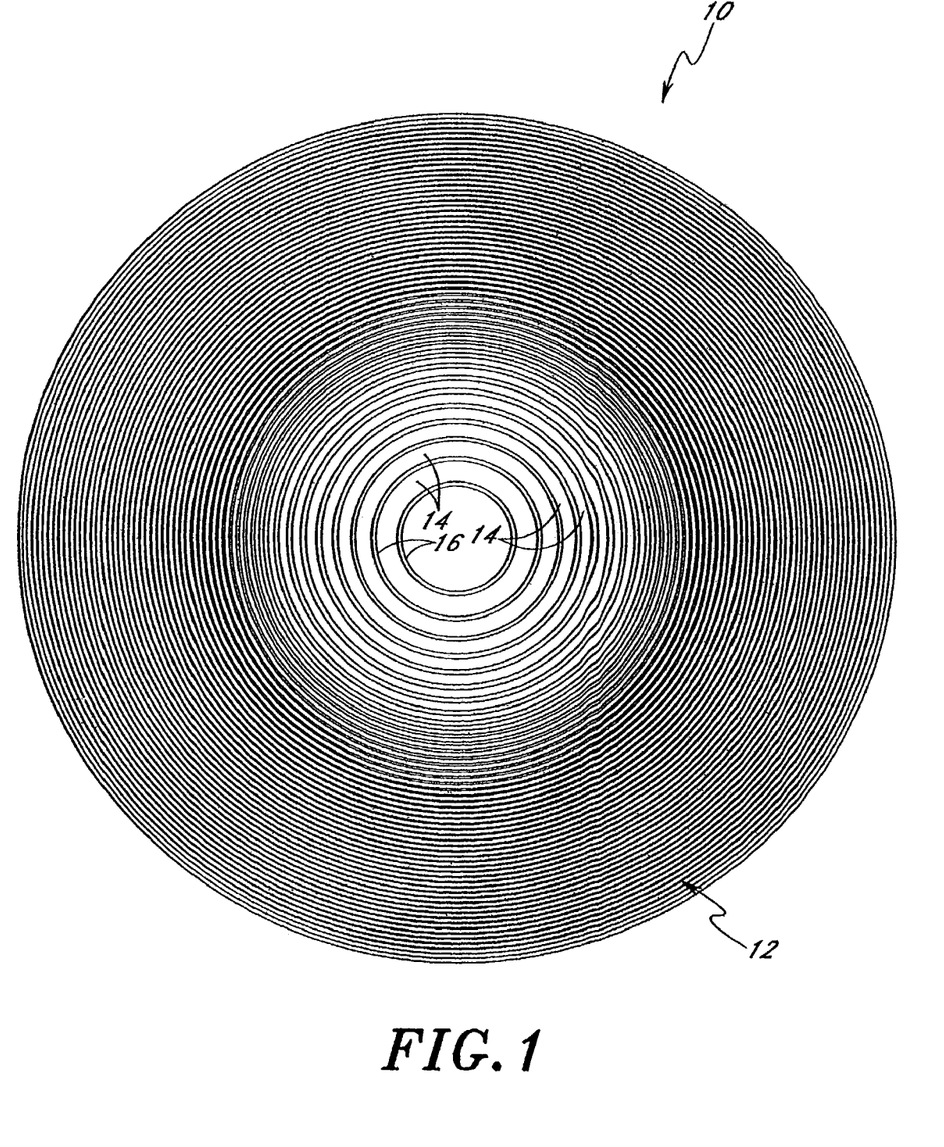
FIG. 1 is a top view of a gridded susceptor face patterned with concentric, circular, constant area bands, constructed in accordance with one embodiment of the present invention.
Figure 2:
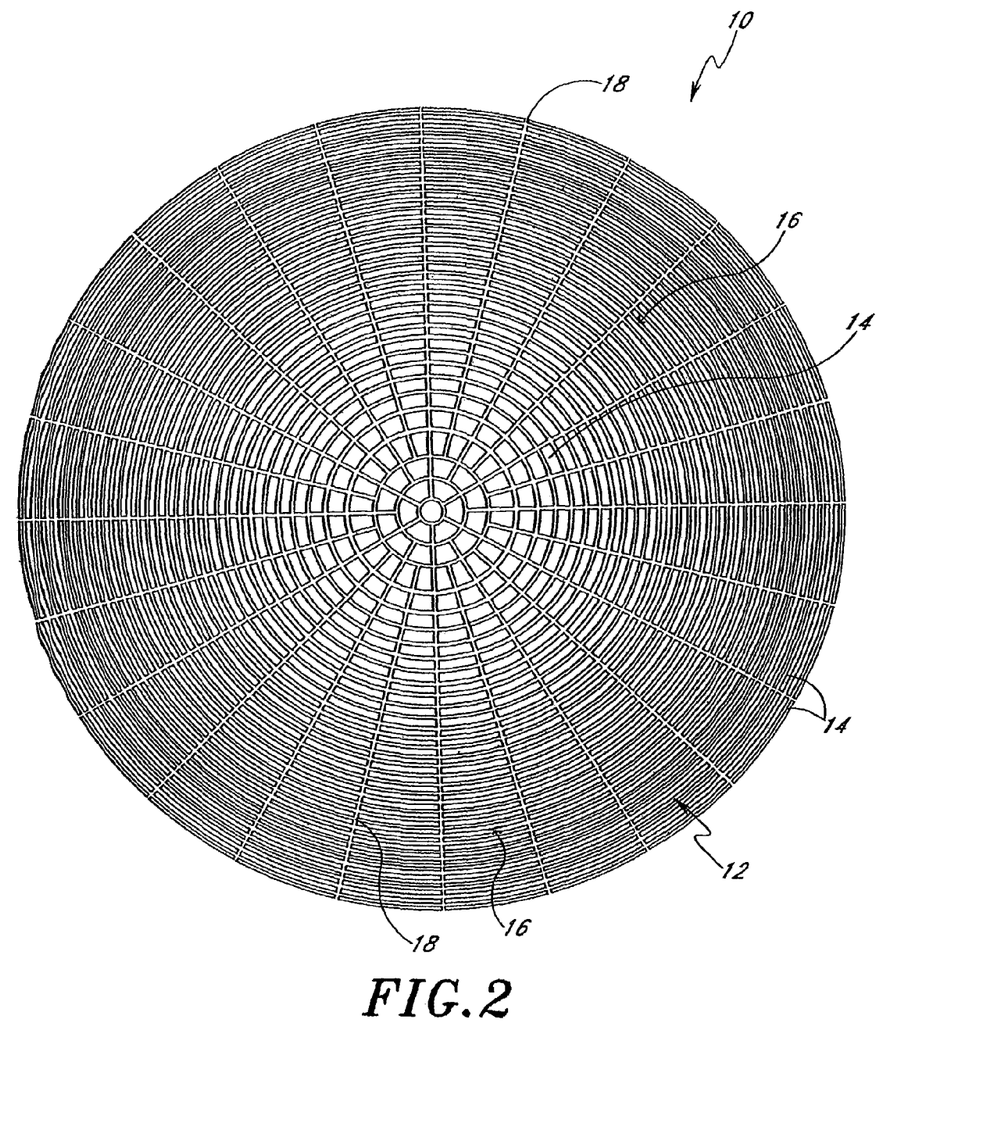
FIG. 2 is a top view of a gridded susceptor face with constant surface area grids in a pattern of concentric circles crosscut by 3 sets of radial spokes, constructed in accordance with another embodiment of the present invention.

FIGS. 1 and 2 illustrate alternative embodiments of the axisymmetric pattern of the gridded front face 12 of susceptor 10 with constant surface area grids 14. Surface areas are kept constant in both embodiments by reducing radial length at greater r positions. The embodiments are symmetrical with respect to both the $\theta$ and r direction. The symbols $\theta$ and r should be understood to have their standard geometrical definitions with r representing radial position and $\theta$ representing angular or circumferential position. Thus, transversing any given radial line will cross the same grid surfaces, and any given circle, concentric within the susceptor boundary, will intercept symmetrical grid surfaces about the susceptor axis. FIG. 1 employs only concentric annular grids 14 separated by circular grooves 16.

FIG. 2 illustrates a concentric circle pattern with radial spoke grooves 18 cutting across the circular grooves 16. Preferably, the circular grooves 16 are crosscut by 3 sets of radial spoke grooves 18, each set originating (i.e., originating in terms of each individual spoke groove's radial point closest to the susceptor center) from a different circular groove 16.

Figure 3:
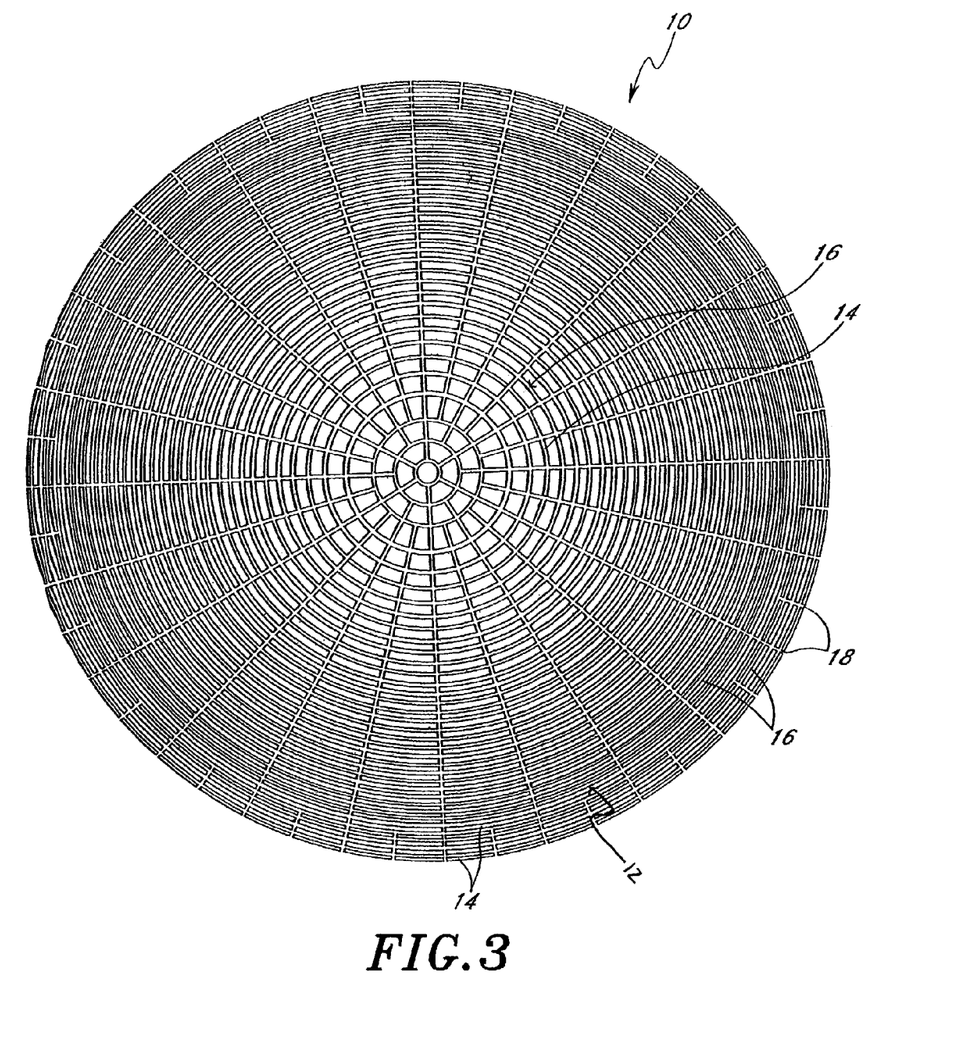
FIG. 3 is a top view of a gridded susceptor face similar to that of FIG. 2, but with a different pattern in an outer zone, constructed in accordance with another embodiment of the present invention.

FIG. 3 illustrates yet another alternative embodiment of the gridded susceptor's axisymmetric pattern with constant surface area in both the $\theta$ and r directions. This embodiment also employs a grid pattern with concentric circular grooves 16 crosscut by radial spoke grooves 18. However, unlike FIGS. 1 and 2, the constant surface area grids alternate between decreasing radial length compensating for increasing circumferential length, in some zones, and the converse (i.e., increasing radial length compensating for decreasing circumferential length) in other zones. Preferably, the concentric circular grooves 16 are crosscut by 4 sets of radial spoke grooves 18, each set of spoke grooves 18 originating (i.e., originating in terms of the each individual groove's radial point closest to the susceptor center) from a different concentric circular groove 16.

One advantage of the gridded susceptor's axisymmetric pattern is that, during dishing, the pattern prevents the coating stresses on a circular susceptor from being exerted along lines of an X-Y grid, as in the prior art. Dishing results from thermal stresses during high temperature susceptor manufacture due to greater surface area on the gridded front face or frontside as compared to the planar bottom surface or backside. Because coating stresses are exerted more evenly across the circular surface area, which is constant in both the $\theta$ and r direction, the tendency of the susceptor to saddle (asymmetrically dish) is reduced, which reduces the extent of damage to the backside of the wafer. Advantageously, the dished susceptor will have a concave bowl shape, with a planar, flat rim at the susceptor periphery, i.e. the periphery falls substantially on the same plane, in contrast to a saddle shape.

Yet another advantage of the axisymmetric susceptor grid patterns shown in FIGS. 1–3 is that the center areas enhance heat transfer from the center of the susceptor, because the edges have a more diminished conduction effect. This heat transfer can help alleviate some wafer problems associated with temperature differences between the center of the wafer and wafer's edge due to edge heat losses.

Figure 4:
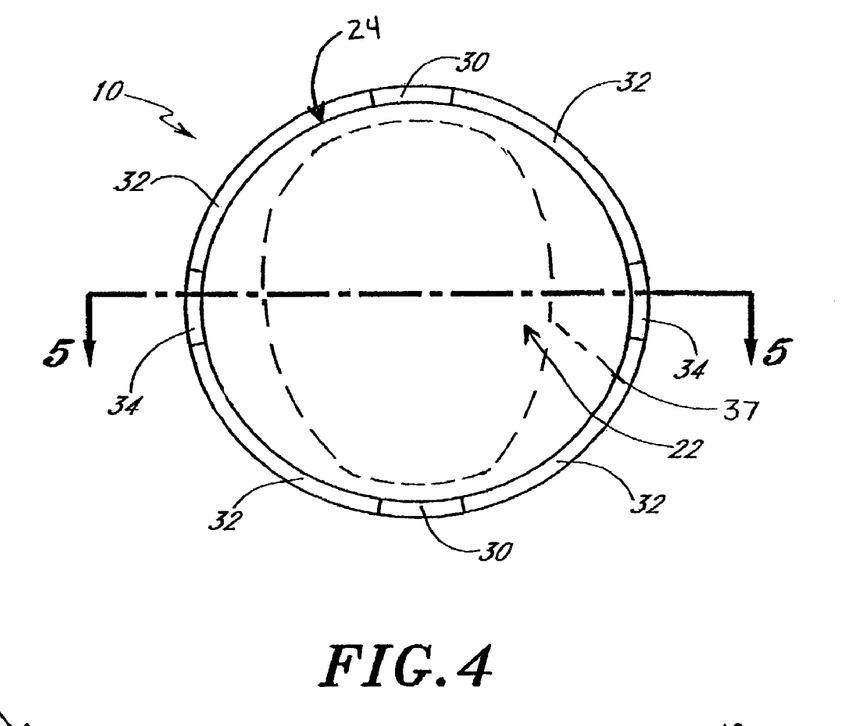
FIG. 4 is a schematic top view of a gridded susceptor face with a variable thermal conductance outer zone, constructed in accordance with another embodiment of the present invention.
Figure 5:
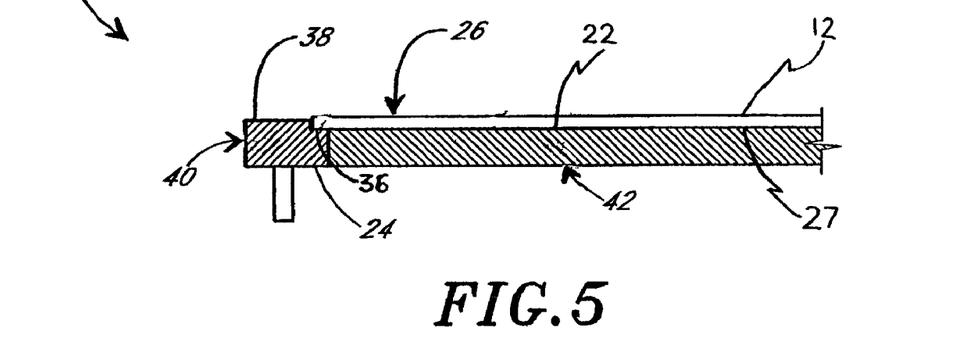
FIG. 5 is a schematic cross-sectional view of the gridded susceptor, taken along line 5—5 of FIG. 4.

FIGS. 4 and 5 illustrates a gridded susceptor with an inner zone 22 and a variable thermal conductance outer zone. A wafer 26 is placed on the susceptor 10 with the wafer's backside 27 in contact with both the grid pattern of the susceptor's axisymmetric, inner zone 22 and in contact with the asymmetric outer zone 24. Preferably, the outer zone 24 is patterned to have radial cuts crosscut by concentric circles. The thermal conductance areas are located so that the two lowest thermal conductance areas 34 occupy opposing sections of the outer zone 24. Transition regions 32 are preferably located between individual high conductance areas 30 and low conductance areas 34. The transition regions 32 preferably allow the change in conductance between high conductance areas 30 and low conductance areas 34 to be gradual enough to reduce the risk of crystallographic slipping during loading and processing. The high conductance areas 30 preferably have higher heat flux paths relative to the low conductance areas 34. In one preferred embodiment, the variable thermal conductance grid pattern of the outer zone 24 contacts the backside 27 of the wafer from below (see ledge 36, FIG. 5). In another embodiment, the variable thermal conductance grid pattern of the outer zone 24 is located above the backside 27 of the wafer on the shoulder outside the perimeter of the wafer upper surface of the pocket (see shoulder 38, FIG. 5).

The variable thermal conductance areas advantageously allow the introduction of slightly higher heat energy in two opposite regions in order to stimulate the thermal expansion of the wafer to a predicted shape. The variable thermal conductance areas are preferably formed by providing the high conductance zones 30 with a larger surface area in contact with the wafer as compared to the low conductance zones 34. A potential heat energy magnitude profile, as shown by a dotted line 37 in FIG. 4, provides a profile of a possible heat pattern which can be applied to the wafer, in accordance with certain preferred embodiments. As shown by dotted line 37 in FIG. 4, the variable thermal conductance areas employed in certain embodiments allow an ovular heat pattern profile to be applied to the wafer, if desired.

In the illustrated embodiment of FIGS. 4 and 5, the asymmetric outer zone 24 is located on an outer ring 40, while the axisymmetric inner zone 22 is located on an independently liftable inner plug 42. The skilled artisan will appreciate that the same thermal behavior upon cold wafer drop can be arranged with a one-piece susceptor. However, as described below, providing the axisymmetric and asymmetric zones on separate pieces allow additional flexibility.

FIG. 5 illustrates a cross-sectional view of the susceptor grid shown in FIG. 4 having a variable thermal conductance outer zone 24. As noted, in the illustrated embodiment, the susceptor 10 includes an independently liftable inner plug 42. Preferably, during processing, if steady state temperature differences are detected across the wafer, the inner plug 42 can be elevated slightly higher than the outer ring 40 in order to improve the steady state temperature uniformity. Elevating the inner plug 42 brings the wafer out of contact with or further away from the variable conductance areas of the outer ring 40, thus reducing the warping of the wafer 26 in the predicted direction. Alternatively, or in addition, the inner plug 42 can be dropped out of contact with the wafer 26 during wafer loading. In this case, spacing between the inner plug 42 and the wafer 26, when dropped upon the axisymmetric outer ring 40, provides an additional variable to tune thermal behavior during the loading process.

In the illustrated embodiment shown in FIG. 5, the outer zone 24 having the variable thermal conductance zones is shown on the outer ring 40 and the inner zone 22 is shown on the inner plug 42. The skilled artisan will appreciate that the inner zone can extend to include a portion of the outer ring in alternate embodiments, while in yet other alternative embodiments the outer zone can extend to include a portion of the plug. For example, in one alternate embodiment the inner zone 22 can include the ledge 36 of the outer ring 40, and the outer zone 24 is located on the shoulder 38 of the outer ring 40.

Figure 6:
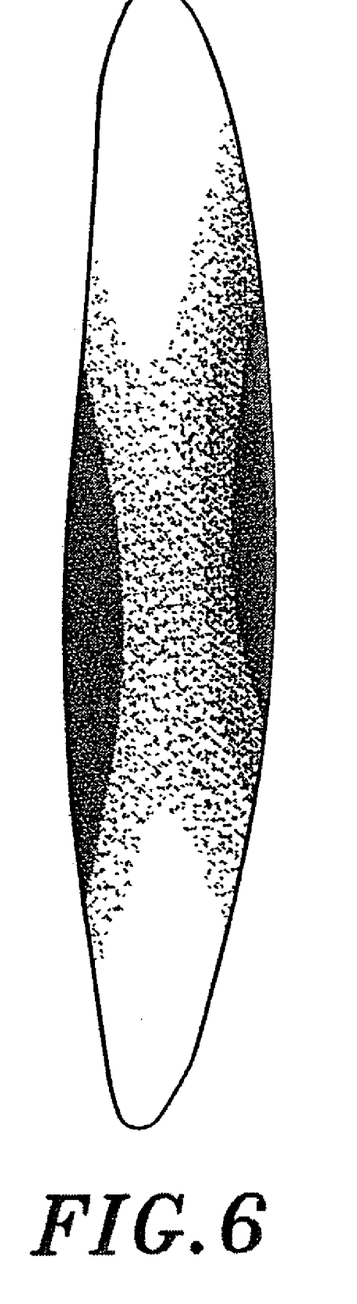
FIG. 6 is a computer generated model of a theoretical wafer deflection using a susceptor with variable thermal conductance outer zones.

FIG. 6 illustrates a model generated to determine the analytical transient shape of a wafer 26 when loaded onto the outer ring 40 with the variable thermal conductance grid pattern, as shown in FIGS. 4 and 5. The model shown in FIG. 6 represents a side perspective of a theoretical wafer shape warped by the asymmetrical thermal gradients across the wafer, as provided in certain preferred embodiments. The asymmetrical thermal gradients are shown in grayscale with lighter areas representing hotter temperatures and darker areas representing cooler areas. It should be understood that the wafer 26 shown in FIG. 6 does not represent a scale version of the physical wafer shape. The wafer 26 receives radiation from the chamber to all surfaces not in contact with and removed from the outer zone 24. Compared to the chamber radiation, the surfaces of the wafer 26 in contact with the outer zone 24 received a slightly higher heat flux from the remaining two low conductance areas 34 and an even higher heat flux from the remaining two high conductance areas 30. The analytical results indicate that the wafer expands quicker at the two zones with the highest heat flux and generate the "saddle shape" shown in FIG. 6.

Figure 7:
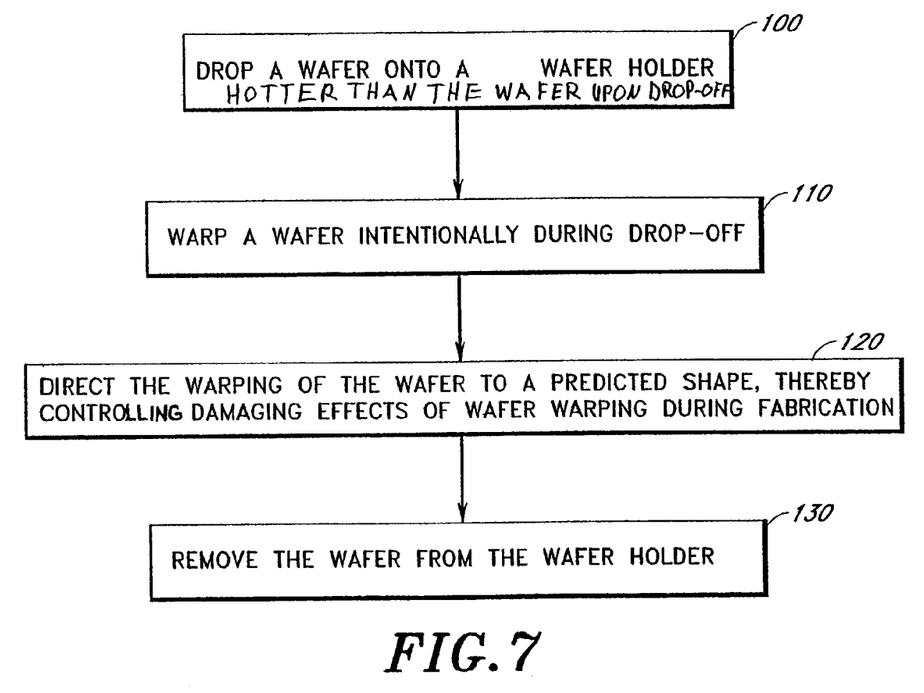
FIG. 7 is a flowchart of a method of intentionally warping a wafer in order to control the damaging effects of wafer warping, in accordance with another embodiment of the present invention.

FIG. 7 shows a method of reducing the damaging effects of wafer warping during fabrication. A wafer is first dropped 100 onto a wafer holder which is hotter than the wafer upon drop-off. During drop-off the wafer is intentionally warped 110. This warping is directed 120 in order to warp the wafer into a predicted shape, thereby controlling the damaging effects of wafer warping during fabrication. Preferably, the predicted shape is a saddle shape, although the wafer may be directed to other predicted shapes as well. Preferably, the susceptor also has an outer zone which primarily introduces heat to the wafer prior to wafer processing. The inner zone then preferably primarily conducts heat to the wafer during wafer processing. After processing, preferably after the wafer has reached steady state temperature and is therefore no longer warped, the wafer is then removed 130 from the wafer holder.

In certain preferred embodiments, the method shown in FIG. 7 includes a subsequent corrective treatment applied to the warped wafer in order to further reduce the detrimental effects of the damage (e.g., crystallographic slip) caused by the warping of the wafer during drop-off onto a hot susceptor. Preferably, this subsequent corrective treatment is selected and pre-tuned to anticipate the damage based on the predicted shape of the wafer. For example, the effectiveness of corrective treatment can be increased through determining the predicted degree and location of the damage based on the predicted shape of the wafer. Advantageously, certain preferred embodiments are configured to apply subsequent corrective treatments and/or processing (e.g., lithography) which allows the treatment or processing of the wafers having the predicted damage to be more effective, as compared with treatments in which the wafer damage is unpredicted, random or is the result of uncontrolled wafer stresses.

Advantageously, predictable wafer curling enables the manufacturer to compensate for issues caused by such curling. For example, the controlled curling will tend to cause wafer backside damage in a consistent manner, from wafer to wafer. This known damage can then be addressed in a subsequent treatment pre-tuned to target and correct the anticipated damage. Alternatively, subsequent processing equipment, such as lithography tools, can be designed to compensate for the known damage.

Advantageously, the method of fabricating wafers shown in FIG. 7 can also be applied to a substantially uniform batch of wafers in order to, during drop-off onto a wafer holder which is hotter than the wafer, warp all the wafers within a batch into substantially the same shape relative to other wafers in the batch.

Figure 8:
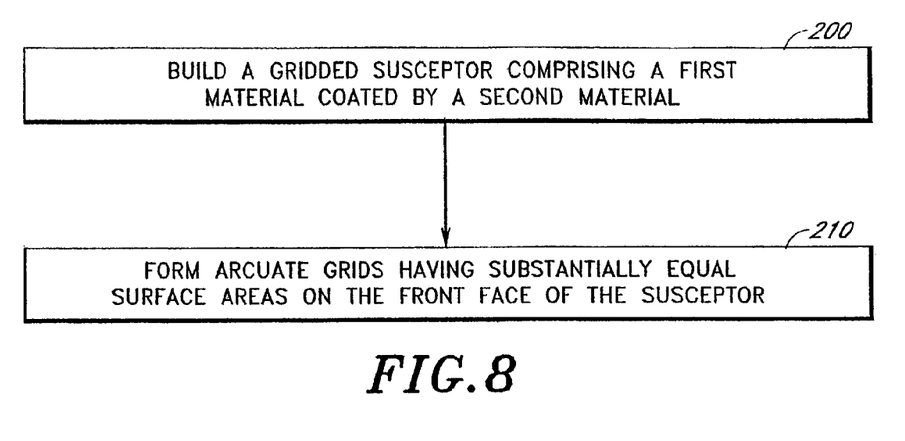
FIG. 8 is a flowchart of a method of forming a gridded susceptor having arcuate grids, in accordance with another embodiment of the present invention.

With reference to FIG. 8, a method of building a gridded susceptor is shown. A gridded susceptor comprising a first material coated by a second material is built 200. Arcuate grids having substantially equal surface areas are formed 210 into the front face of the susceptor. In preferred embodiments, at least the inner zone of the susceptor is built by forming arcuate grids in the first material and then the second material is substantially uniformly coated over the first material. Preferably, the completed gridded susceptor exhibits a concave bowl shape with a rim falling substantially along one plane. Advantageously, the planar rimmed, concave bowl shape allows more consistent contact between the susceptor and wafer. The front face of the susceptor preferably includes variable thermal conductance zones. In one embodiment, the susceptor is also formed to have an inner plug and an outer ring, the plug and ring being moveable with respect to one another. In this case, at least the inner plug is provided with substantially equal surface area grids, as indicated in FIG. 8.

It will be appreciated by those skilled in the art that various omissions, additions and modifications may be made to the processes described above without departing from the scope of the invention, and all such modifications and changes are intended to fall within the scope of the invention, as defined by the appended claims.

We claim:

1. A grid patterned susceptor, comprising:
   a circular susceptor face with an arcuate grid pattern defined by a pattern of grooves on the face of the susceptor,
   said pattern of grooves comprising circumferential grooves concentric about a center of the circular face, and
   equiangular radial grooves emanating outwards from the circumferential grooves and pointing inwards to the center of the circular face and cutting the concentric grooves,
   wherein each arcuate grid on said circular face is a raised surface bounded on all sides by grooves and has substantially the same surface area as any other arcuate grid on the circular susceptor face.

2. The susceptor of claim 1, wherein the arcuate grids are continuous annular projections between adjacent circular grooves.

3. The susceptor of claim 1, wherein the grid patterned susceptor is substantially shaped as a concave bowl.

4. The susceptor of claim 1, wherein the grid pattern is defined by concentric circular grooves.

5. The susceptor of claim 4, wherein the susceptor face is further configured with spoke grooves running radially and cutting across the concentric grooves.

6. The susceptor of claim 5, wherein the spoke grooves are provided as a plurality of sets of radial grooves, each set of radial grooves originating from a different concentric circle.

7. The susceptor of claim 5, wherein the arcuate grids are progressively narrower in radial direction with increasing radial distance from a center of the susceptor.

8. The susceptor of claim 5, wherein the grid pattern comprises:
- a first area wherein the surface area of the grids is configured to be substantially constant through decreased radial length compensating for increased circumferential length at greater radial distance from a center of the susceptor; and
- a second area wherein the surface area of the grids is configured to be substantially constant through increased radial length compensating for decreased circumferential length at greater radial distance from the center of the susceptor.

9. The susceptor of claim 8, wherein the grid pattern alternates between patterns of the first area and patterns of the second area as a radius of the susceptor is traversed.

10. A grid patterned susceptor, comprising:
- a circular susceptor face; and a plurality of arcuate grids defined as raised continuous surfaces surrounded on all sides by circular and straight line grooves on the face of the susceptor, said arcuate grids forming concentric circles about a center of the circular susceptor face, said arcuate grids having top substantially planar surfaces, wherein the top surface of every arcuate grid in any given concentric circle has a surface area that is substantially the same as the top surface of any other arcuate grid in that concentric circle, and wherein the top surface of any arcuate grid in one concentric circle has substantially the same surface area as the top surface of any other arcuate grid in any other concentric circle.

* * * * *

UNITED STATES PATENT AND TRADEMARK OFFICE
CERTIFICATE OF CORRECTION

| | | |
|---|---|---|
| PATENT NO. | : 7,033,445 B2 | Page 1 of 1 |
| APPLICATION NO. | : 10/327296 | |
| DATED | : April 25, 2006 | |
| INVENTOR(S) | : Tony J. Keeton and Zachary J. Lutz | |

It is certified that error appears in the above-identified patent and that said Letters Patent is hereby corrected as shown below:

On the Title page, Col. 2, line 2, after "5,198,034 A 3/1993" please delete "deBoer et al." and insert --De Boer et al.--, therefor.

In the Specification

In Col. 1, line 19 (approx.), please delete "substrates" and insert --substrate--, therefor.

In Col. 2, line 23, after "predicted," please insert --warped shape.--.

In Col. 2, line 38, please delete "radical" and insert --radial--, therefor.

Signed and Sealed this
Twelfth Day of November, 2013

Teresa Stanek Rea
*Deputy Director of the United States Patent and Trademark Office*